United States Patent
Iijima

(10) Patent No.: US 11,133,151 B2
(45) Date of Patent: Sep. 28, 2021

(54) TRANSMISSION ELECTRON MICROSCOPE AND METHOD OF CONTROLLING SAME

(71) Applicant: JEOL Ltd., Tokyo (JP)

(72) Inventor: Hirofumi Iijima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/095,848

(22) Filed: Nov. 12, 2020

(65) Prior Publication Data

US 2021/0151286 A1 May 20, 2021

(30) Foreign Application Priority Data

Nov. 15, 2019 (JP) .............................. JP2019-206804

(51) Int. Cl.
*H01J 37/26* (2006.01)
*H01J 37/30* (2006.01)

(52) U.S. Cl.
CPC ........ *H01J 37/261* (2013.01); *H01J 37/3007* (2013.01); *H01J 2237/0451* (2013.01); *H01J 2237/103* (2013.01); *H01J 2237/2802* (2013.01)

(58) Field of Classification Search
CPC .......... H01J 37/26; H01J 37/261; H01J 37/28; H01J 37/3007; H01J 2237/0451; H01J 2237/103; H01J 2237/2802
See application file for complete search history.

(56) References Cited

U.S. PATENT DOCUMENTS

| 6,531,698 | B1 * | 3/2003 | Benner | H01J 37/04 250/311 |
| 2003/0132383 | A1 * | 7/2003 | Benner | H01J 37/265 250/311 |
| 2005/0103977 | A1 * | 5/2005 | Krymski | H04N 3/1562 250/208.1 |
| 2009/0133167 | A1 * | 5/2009 | Yakushevska | H01J 37/265 850/3 |

FOREIGN PATENT DOCUMENTS

JP 201523010 A 2/2015

* cited by examiner

*Primary Examiner* — David E Smith
(74) *Attorney, Agent, or Firm* — The Webb Law Firm

(57) ABSTRACT

A transmission electron microscope includes an electron beam source emitting an electron beam and an illumination optical system for directing the emitted electron beam at a sample. The illumination optical system has a first condenser lens, a second condenser lens, a third condenser lens, a fourth condenser lens, an objective lens, and a condenser aperture disposed at the position of the second condenser lens. The third condenser lens and the fourth condenser lens cooperate to make the position of the condenser aperture and a sample plane conjugate to each other. The first condenser lens and the second condenser lens cooperate to make the electron beam source and a front focal plane of the objective lens conjugate to each other while the conjugate relationship between the position of the condenser aperture and the sample plane is maintained by the third and fourth condenser lenses.

4 Claims, 7 Drawing Sheets

TRANSMISSION ELECTRON MICROSCOPE AND METHOD OF CONTROLLING SAME

CROSS-REFERENCE TO RELATED APPLICATION

This application claims priority to Japanese Patent Application No. 2019-206804 filed Nov. 15, 2019, the disclosure of which is hereby incorporated by reference in its entirety.

BACKGROUND OF THE INVENTION

1. Field of the Invention

The present invention relates to a transmission electron microscope (TEM) and to a method of controlling it.

2. Description of the Related Art

An optical system having at least two stages of condenser lenses interlockingly excitable and capable of permitting electron source images focused by the condenser lenses to be set at plural positions is disclosed as a TEM illumination optical system, for example, in JP-A-2015-23010. With this known illumination optical system, adjustment of the illumination intensity and variable adjustment of the diameter of the illumination spot can be made with simple manipulations.

Also, a TEM illumination optical system is known which has three stages of condenser lenses. Furthermore, a TEM illumination optical system having four stages of condenser lenses is known.

In a transmission electron microscope, when TEM images such as bright field images, dark field images, and high-resolution electron microscopy (HREM) images are derived, a sample is illuminated with parallel electron rays (known as parallel illumination). In the illumination optical system, the sample can be illuminated with parallel electron rays by making the electron beam source and the front focal plane of the objective lens conjugate with each other (known as Kohler illumination).

The illumination optical system of a transmission electron microscope includes a condenser aperture for adjusting the angular aperture and dose of the electron beam. It is known that in a transmission electron microscope, Fresnel fringes are produced around the edge of the condenser aperture because of defocus of the condenser aperture in the sample plane. Under normal imaging conditions, the area of the illumination coverage provided by the electron beam is sufficiently wider than the field of view for imaging and, therefore, Fresnel fringes do not appear within the field of view for imaging.

Where a sample having low resistance to an electron beam is to be observed, electron beam irradiation will damage the sample and so it is desirable to illuminate only the field of view for imaging. However, if the illumination spot size is reduced, Fresnel fringes will appear within the field of view. Accordingly, it is impossible to narrow the illumination spot size, and, during observation, the spot size must be so increased that the Fresnel fringes appear outside the field of view for imaging.

SUMMARY OF THE INVENTION

One aspect of the transmission electron microscope associated with the present invention has: an electron beam source emitting an electron beam; and an illumination optical system for directing the emitted electron beam at a sample. The illumination optical system has a first condenser lens, a second condenser lens disposed behind the first condenser lens, a third condenser lens disposed behind the second condenser lens, a fourth condenser lens disposed behind the third condenser lens, an objective lens disposed behind the fourth condenser lens, and a condenser aperture disposed at the position of the second condenser lens. The third and fourth condenser lenses cooperate to make the position of the condenser aperture and a sample plane conjugate to each other. The first and second condenser lenses cooperate to make the electron beam source and a front focal plane of the objective lens conjugate to each other while the conjugate relationship between the position of the condenser aperture and the sample plane is maintained by the third and fourth condenser lenses.

In this transmission electron microscope, the position of the condenser aperture and the sample plane can be made conjugate to each other, and the electron beam source and the front focal plane of the objective lens can be made conjugate to one another. Therefore, if the sample is illuminated with parallel electron rays, it is possible to prevent Fresnel fringes of the condenser aperture from forming in the sample plane. Accordingly, in this transmission electron microscope, TEM imaging can be done by a parallel illumination of a narrow area with an electron beam.

A control method associated with the present invention is for use in a transmission electron microscope which has: an electron beam source emitting an electron beam; and an illumination optical system for directing the emitted electron beam at a sample. The illumination optical system has: a first condenser lens; a second condenser lens disposed behind the first condenser lens; a third condenser lens disposed behind the second condenser lens; a fourth condenser lens disposed behind the third condenser lens; an objective lens disposed behind the fourth condenser lens; and a condenser aperture disposed at the position of the second condenser lens. The control method starts with setting the third and fourth condenser lenses to a first set of conditions in which the position of the condenser aperture and a sample plane are made conjugate to each other. Then, the first and second condenser lenses are set to a second set of conditions in which the electron beam source and a front focal plane of the objective lens are made conjugate to each other while the first set of conditions for the third and fourth condenser lenses is maintained.

In this control method for the transmission electron microscope, the position of the condenser aperture and the sample plane can be made conjugate to each other. Also, the electron beam source and the front focal plane of the objective lens can be made conjugate to each other. Therefore, if the sample is illuminated with parallel electron rays, it is possible to prevent Fresnel fringes of the condenser aperture from forming in the sample plane. Consequently, this control method for the transmission electron microscope allows for TEM imaging while illuminating a narrow illumination coverage with parallel electron rays.

DESCRIPTION OF THE INVENTION

The preferred embodiments of the present invention are hereinafter described in detail by referring to the accompanying drawings. It is to be understood that the embodiments provided below are not intended to unduly restrict the scope and content of the present invention delineated by the appended claims and that not all the configurations described below are essential constituent components of the invention.

1. Electron Microscope

Figure 1:
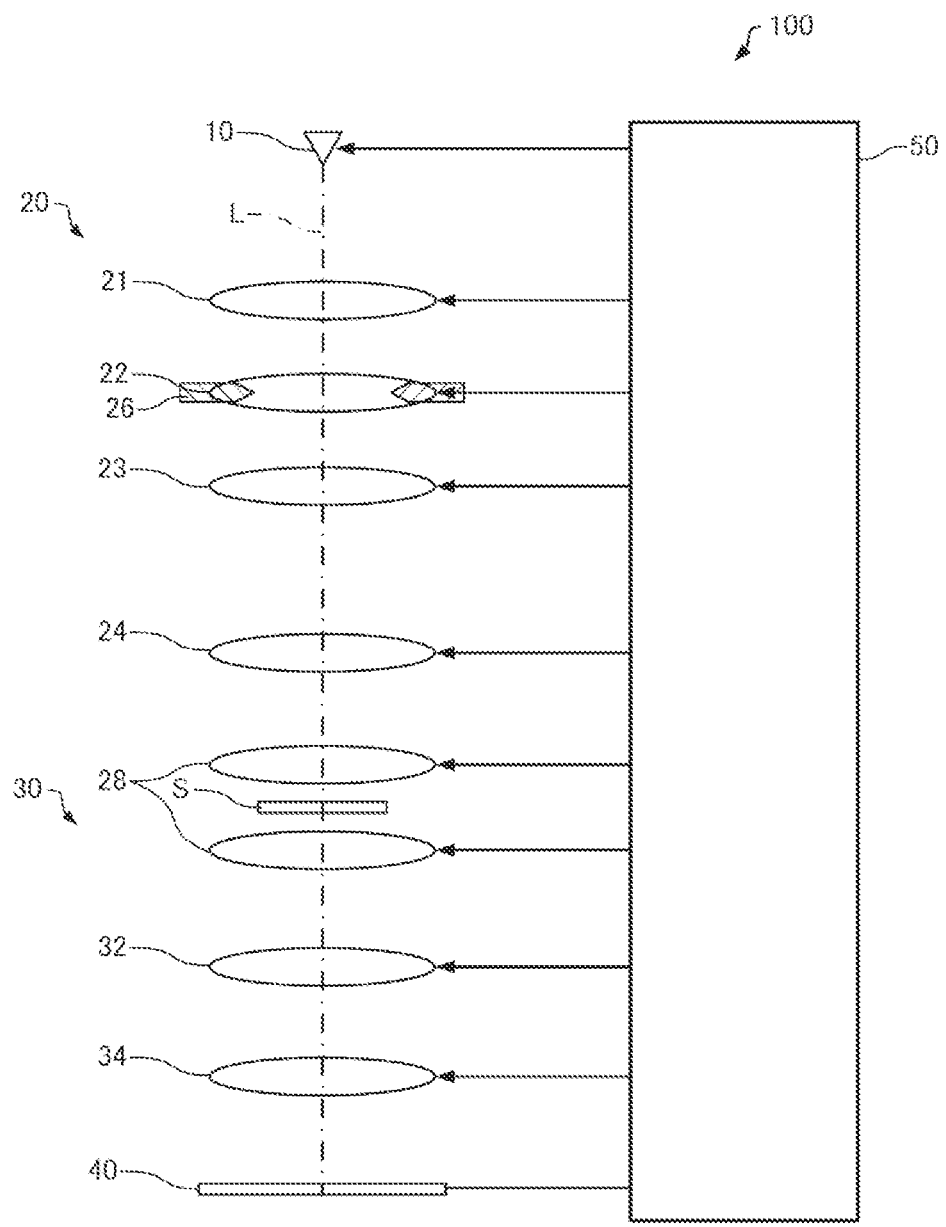
FIG. 1 is an electron ray diagram illustrating the configuration of a transmission electron microscope associated with one embodiment of the present invention.

A transmission electron microscope associated with one embodiment of the present invention is first described by referring to FIG. 1, which illustrates the configuration of the transmission electron microscope, 100, associated with the first embodiment.

As shown in FIG. 1, the transmission electron microscope 100 includes an electron beam source 10, an illumination optical system 20, an imaging optical system 30, an electronic imager 40, and a controller 50.

The electron beam source 10 emits an electron beam. For example, the electron beam source 10 is an electron gun which emits an electron beam by accelerating electrons, released from a cathode, by means of an anode.

The electron beam released from the electron beam source 10 is made to impinge on a sample S by the action of the illumination optical system 20. The illumination optical system 20 is equipped with four stages of condenser lenses. The illumination optical system 20 includes a first condenser lens 21, a second condenser lens 22, a third condenser lens 23, a fourth condenser lens 24, a condenser aperture 26, and an objective lens 28.

The first condenser lens 21 is disposed behind (i.e., downstream of) the electron beam source 10. The second condenser lens 22 is located behind the first condenser lens 21. The third condenser lens 23 is located behind the second condenser lens 22. The fourth condenser lens 24 is positioned behind the third condenser lens 23. The objective lens 28 is located behind the fourth condenser lens 24. The first condenser lens 21, second condenser lens 22, third condenser lens 23, fourth condenser lens 24, and objective lens 28 are arranged in this order along an optical axis L.

The condenser aperture 26 is located at the position of the second condenser lens 22, i.e., within the second condenser lens 22. The functions of the illumination optical system 20 are described in detail later.

The sample S is supported by a sample holder (not shown). For example, the objective lens 28 has top and bottom polepieces between which the sample S is positioned.

The imaging optical system 30 forms TEM (transmission electron microscopy) images from electrons transmitted through the sample S. The TEM images include bright field images, dark field images, and high-resolution electron microscopy (HREM) images. The imaging optical system 30 includes the objective lens 28, an intermediate lens 32, and a projector lens 34. The objective lens 28 is included in both the illumination optical system 20 and the imaging optical system 30.

The objective lens 28 is an initial stage of lens for forming a TEM image from electrons transmitted through the sample S. The intermediate lens 32 is disposed behind the objective lens 28. The projector lens 34 is positioned behind the intermediate lens 32.

The intermediate lens 32 focuses the TEM image formed by the objective lens 28, magnifies the focused TEM image, and forms a magnified TEM image on the object plane of the projector lens 34. The projector lens 34 further magnifies the TEM image magnified by the intermediate lens 32 and focuses the TEM image onto the imager 40.

Lenses constituting the aforementioned illumination optical system 20 and lenses constituting the imaging optical system 30 are electron lenses which produce magnetic fields for focusing the electron beam, for example, by passing excitation currents through coils. With such an electron lens, its magnification factor or focal length can be varied by varying the excitation current.

The imager 40 captures the TEM image focused by the imaging optical system 30. The imager 40 is a detector for detecting electrons. For example, the imager 40 is a digital camera such as a CCD (charged coupled device) or CMOS (complementary metal-oxide-semiconductor) camera.

The controller 50 controls various parts of the transmission electron microscope 100. The controller 50 includes a processor such as a CPU (central processing unit) and storage devices such as a RAM (random access memory) and a ROM (read only memory). Computer programs for performing various control operations are stored in the storage devices as well as data. The functions of the controller 50 can be accomplished by executing such programs by means of the processor. The controller 50 may further include a manual control section permitting a user to enter scanning information and a display section for displaying the captured TEM images and other images.

2. Illumination Optical System

Figure 2:
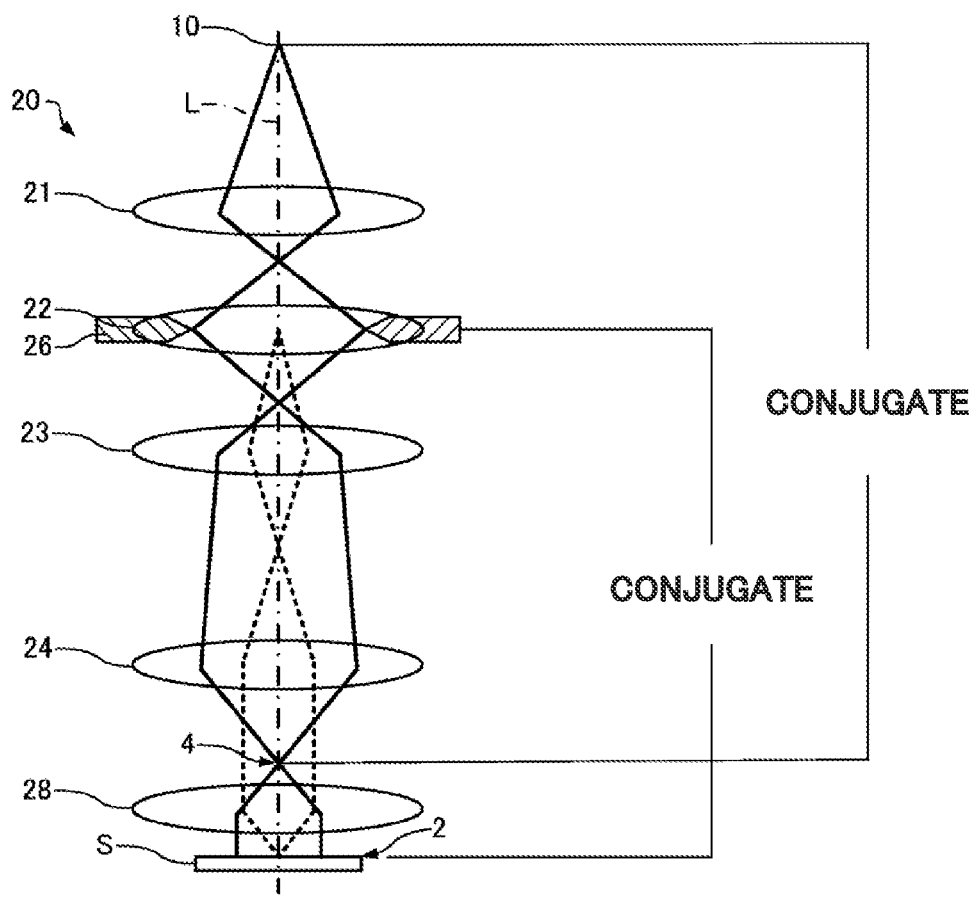
FIGS. 2-5 are electron ray diagrams illustrating the configuration and operation of the illumination optical system of the microscope of FIG. 1.

FIG. 2 is an electron ray diagram illustrating the illumination optical system 20. The configuration of the illumination optical system 20 and electron rays are shown in FIG. 2.

In the illumination optical system 20, the third condenser lens 23 and the fourth condenser lens 24 cooperate to make the position of the condenser aperture 26 and the sample plane 2 conjugate to each other. The sample plane 2 provides a position at which the sample S is placed.

In the illumination optical system 20, the first condenser lens 21 and the second condenser lens 22 cooperate to make the electron beam source 10 and the front focal plane 4 of the objective lens 28 conjugate to each other while the conjugate relationship is maintained between the position of the condenser aperture 26 and the sample plane 2 by the third condenser lens 23 and the fourth condenser lens 24.

In this way, in the illumination optical system 20, the third condenser lens 23 and the fourth condenser lens 24 are used to make the position of the condenser aperture 26 and the sample plane 2 conjugate to each other. Furthermore, the first condenser lens 21 and the second condenser lens 22 are used to make the electron beam source 10 and the front focal plane 4 of the objective lens 28 conjugate to each other.

In the illumination optical system 20, the first condenser lens 21 is used to vary the electron beam dose, i.e., the brightness. Furthermore, in the illumination optical system 20, the sample S can be illuminated by parallel electron rays (known as Kohler illumination) by making the electron beam source 10 and the front focal plane 4 of the objective lens 28 conjugate to each other. Also, in the illumination optical system 20, it is possible to prevent Fresnel fringes of the condenser aperture 26 from being induced in the sample plane 2 by making the position of the condenser aperture 26 and the sample plane 2 conjugate to each other.

Figure 3:
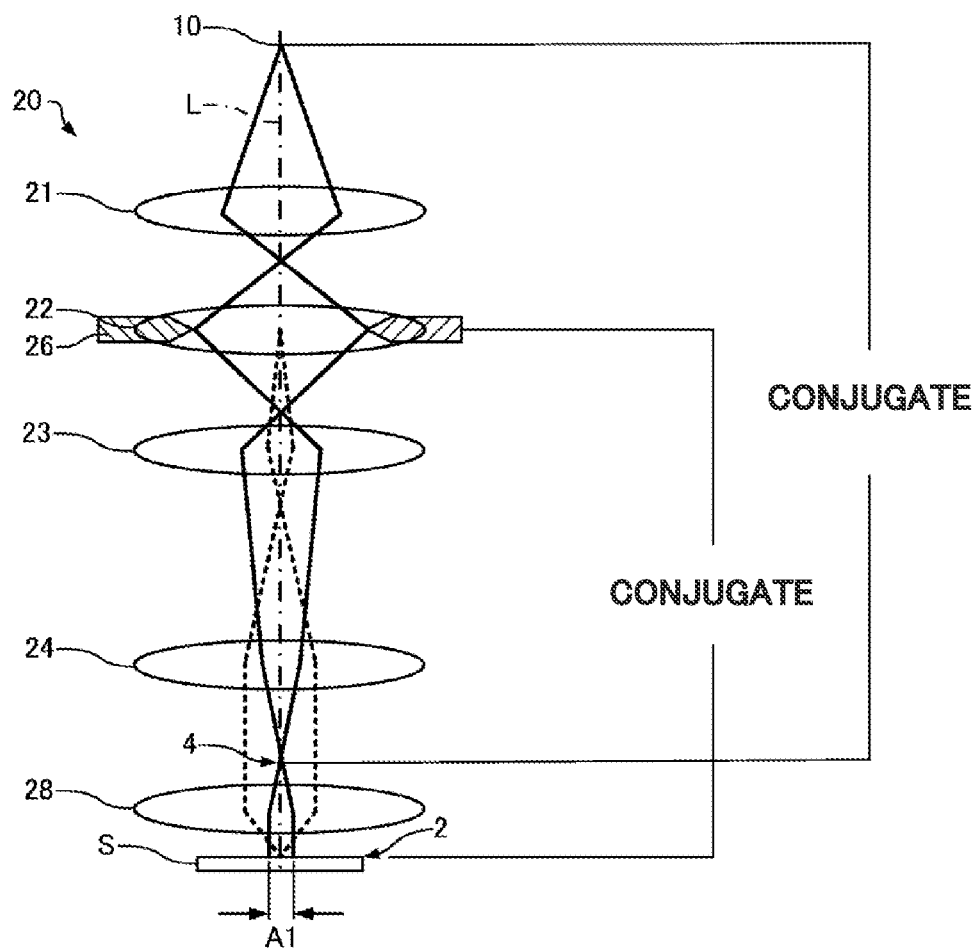
Figure 4:
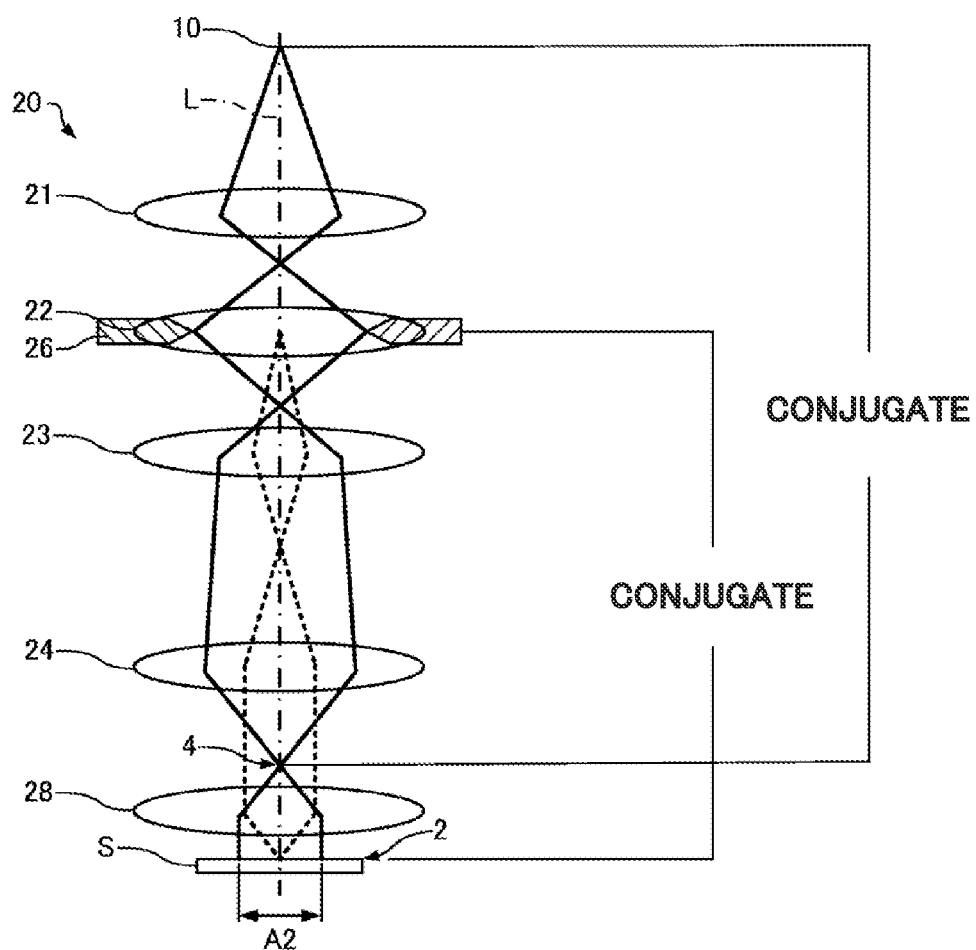
Figure 5:
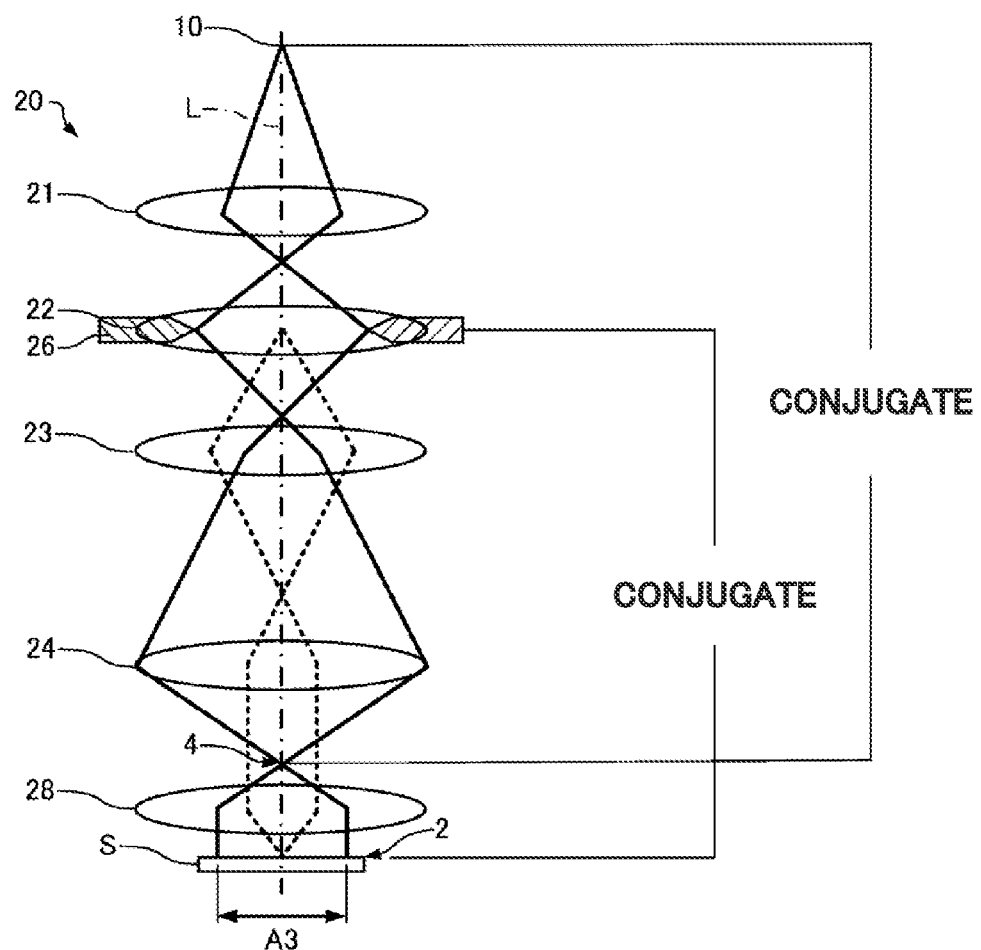

FIGS. 3-5 illustrate the operation of the illumination optical system 20. FIG. 3 illustrates a case in which the illumination coverage is a first range A1. FIG. 4 illustrates a case in which the illumination coverage is a second range A2. FIG. 5 illustrates a case in which the illumination coverage is a third range A3. The first range A1 is narrower than the second range A2, which in turn is narrower than the third range A3.

As shown in FIGS. 3-5, in the illumination optical system 20, the illumination coverage provided by the electron beam can be varied by varying the excitations of the second condenser lens 22, third condenser lens 23, and fourth condenser lens 24 while maintaining the conjugate relationship between the position of the condenser aperture 26 and the sample plane 2 and the conjugate relationship between the electron beam source 10 and the front focal plane 4 of the objective lens 28. Consequently, an illumination optical system can be accomplished which can implement parallel illumination by electron rays without producing Fresnel fringes in the sample plane 2 and which can vary the illumination coverage. In the illumination optical system 20, no Fresnel fringes are induced in the sample plane 2 and so even a quite small illumination coverage area which is less than 1 µm in diameter, for example, can be uniformly illuminated with electron rays.

3. Processing

When instructions for illuminating the sample S with parallel electron rays are entered, the controller 50 sets the third condenser lens 23 and the fourth condenser lens 24 to a first set of conditions where the position of the condenser aperture 26 and the sample plane 2 are made conjugate to each other. Under this first set of conditions, the controller 50 sets the first condenser lens 21 and the second condenser lens 22 to a second set of conditions where the electron beam source 10 and the front focal plane 4 of the objective lens 28 are made conjugate to each other.

As a result, in the illumination optical system 20, the electron beam source 10 and the front focal plane 4 of the objective lens 28 are conjugate to each other, and the position of the condenser aperture 26 and the sample plane 2 are conjugate to each other. Consequently, the sample S can be illuminated with parallel electron rays. Also, it is possible to prevent Fresnel fringes of the condenser aperture 26 from forming in the sample plane 2.

When instructions are entered to set the illumination coverage to the first range A1, the controller 50 sets the operational conditions of the second condenser lens 22, third condenser lens 23, and fourth condenser lens 24 such that the illumination coverage is the first range A1 as shown in FIG. 3 while maintaining both the conjugate relationship between the position of the condenser aperture 26 and the sample plane 2 and the conjugate relationship between the electron beam source 10 and the front focal plane 4 of the objective lens 28.

When instructions for setting the illumination coverage to the second range A2 are entered, the controller 50 sets the operational conditions of the second condenser lens 22, third condenser lens 23, and fourth condenser lens 24 such that the illumination coverage provided by the electron rays is the second range A2 as shown in FIG. 4 while maintaining both the conjugate relationship between the position of the condenser aperture 26 and the sample plane 2 and the conjugate relationship between the electron beam source 10 and the front focal plane 4 of the objective lens 28.

When instructions for setting the illumination coverage to the third range A3 are entered, the controller 50 sets the operational conditions of the second condenser lens 22, third condenser lens 23, and fourth condenser lens 24 such that the illumination coverage is the third range A3 as shown in FIG. 5 while maintaining both the conjugate relationship between the position of the condenser aperture 26 and the sample plane 2 and the conjugate relationship between the electron beam source 10 and the front focal plane 4 of the objective lens 28.

In this way, the controller 50 performs processing to vary the illumination coverage provided by the electron beam while maintaining both the conjugate relationship between the position of the condenser aperture 26 and the sample plane 2 and the conjugate relationship between the electron beam source 10 and the front focal plane 4 of the objective lens 28.

For example, the operational conditions of the illumination optical system 20 which set the illumination coverage provided by electron rays to the first range A1, the operational conditions of the illumination optical system 20 which set the illumination coverage to the second range A2, and the operational conditions of the illumination optical system 20 which set the illumination coverage to the third range A3 may be previously stored in a storage section of the controller 50. Furthermore, a mathematical function or numerical table for deriving the operational conditions of the illumination optical system 20 from illumination coverages may be stored in the storage section of the controller 50. The controller 50 may set the operational conditions of the illumination optical system 20 from an entered illumination coverage, using operational conditions, functions, tables, or the like stored in the storage section.

4. Effects

In the transmission electron microscope 100, the illumination optical system 20 has the first condenser lens 21, second condenser lens 22, third condenser lens 23, fourth condenser lens 24, condenser aperture 26, and objective lens 28. The third condenser lens 23 and fourth condenser lens 24 operate together to make the position of the condenser aperture 26 and the sample plane 2 conjugate to each other. The first condenser lens 21 and the second condenser lens 22 operate together to make the electron beam source 10 and the front focal plane 4 of the objective lens 28 conjugate to each other while the conjugate relationship between the position of the condenser aperture 26 and the sample plane 2 is maintained by the third condenser lens 23 and the fourth condenser lens 24.

In the transmission electron microscope 100, the position of the condenser aperture 26 and the sample plane 2 are conjugate to each other and, therefore, it is possible to prevent Fresnel fringes of the condenser aperture 26 from being induced in the sample plane 2. Furthermore, since the electron beam source 10 and the front focal plane 4 of the objective lens 28 are conjugate to each other, the sample S can be illuminated with parallel electron rays. Accordingly, in the transmission electron microscope 100, even if the sample S is illuminated with parallel electron rays, it is possible to prevent Fresnel fringes of the condenser aperture 26 from being generated in the sample plane 2. In consequence, in the transmission electron microscope 100, TEM imaging can be performed while illuminating a narrow illumination coverage with parallel electron rays.

In the transmission electron microscope 100, the illumination coverage on the sample plane 2 provided by the electron beam can be varied by varying the excitations of the second condenser lens 22, third condenser lens 23, and fourth condenser lens 24 while maintaining both the conjugate relationship between the position of the condenser aperture 26 and the sample plane 2 and the conjugate relationship between the electron beam source 10 and the front focal plane 4 of the objective lens 28.

Figure 6:
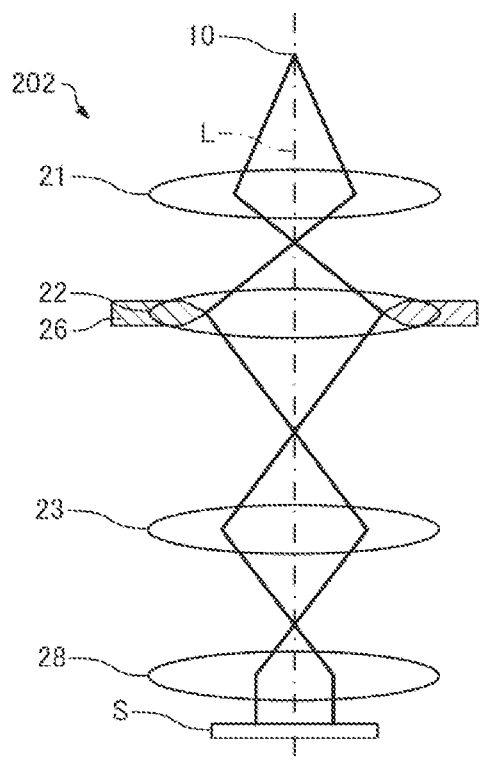
FIGS. 6-8 are electron ray diagrams illustrating the configuration and operation of the illumination optical system of a transmission electron microscope associated with Comparative Example.
Figure 7:
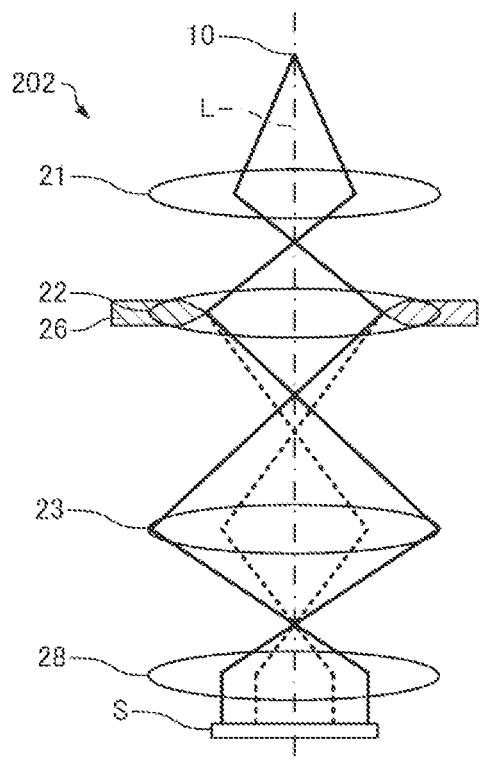
Figure 8:
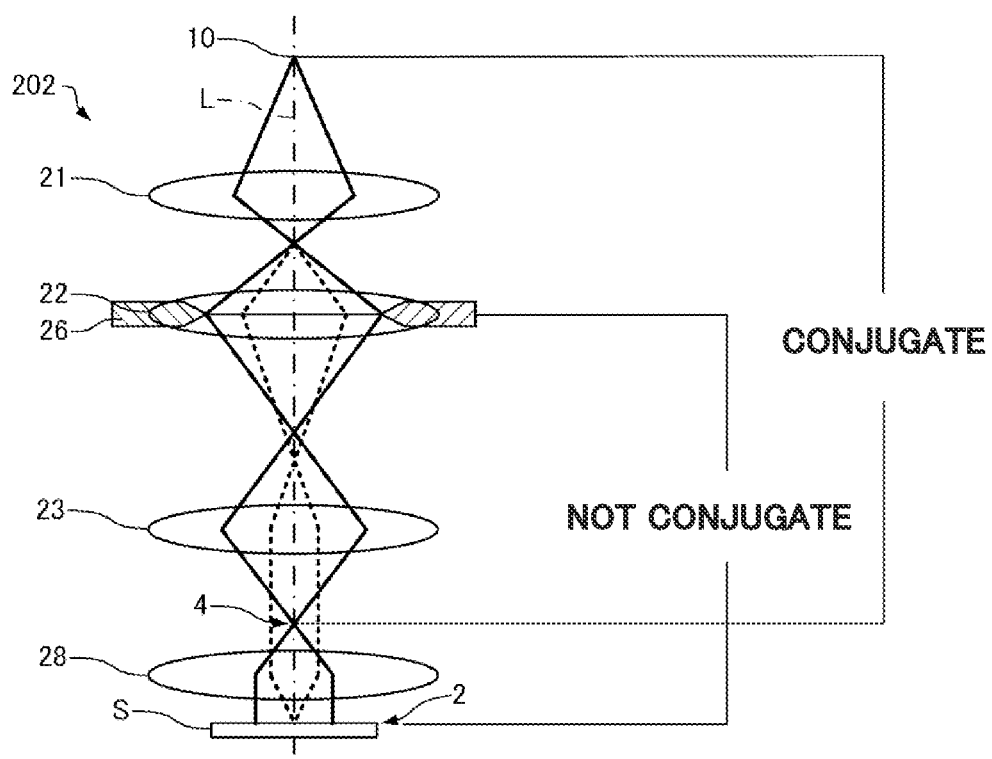

The illumination optical system 20 equipped with the four stages of condenser lenses is compared below with an illumination optical system equipped with three stages of condenser lenses to thereby explain in detail the effects of the above-described transmission electron microscope 100. FIG. 6 is an electron ray diagram illustrating the configuration of the illumination optical system 202 of the transmission electron microscope of the Comparative Example. FIGS. 7 and 8 are electron ray diagrams illustrating the operation of the illumination optical system 202 of the transmission electron microscope of the Comparative Example.

The illumination optical system, 202, of the transmission electron microscope of the Comparative Example has three stages of condenser lenses (first condenser lens 21, second condenser lens 22, and third condenser lens 23), a condenser aperture 26, and an objective lens 28 as shown in FIG. 6.

As shown in FIG. 8, in the illumination optical system 202 equipped with the three stages of condenser lenses, the sample S can be illuminated with parallel electron rays by making the electron beam source 10 and the front focal plane 4 of the objective lens 28 conjugate to each other. Also, in the illumination optical system 202, the illumination coverage provided by the electron rays can be varied by varying the excitations of the second condenser lens 22 and third condenser lens 23 as shown in FIG. 7.

In the illumination optical system 202, Fresnel fringes are produced around the edge of the condenser aperture 26. Therefore, if the illumination coverage is sufficiently wider than the field of view of the microscope, the Fresnel fringes will not appear within the field of view but, if the illumination coverage is narrowed, the Fresnel fringes will appear within the field of view of the microscope.

The Fresnel fringes of the condenser aperture 26 are induced by defocus of the condenser aperture 26 in the sample plane 2. In the illumination optical system 202, the position of the condenser aperture 26 and the sample plane 2 are not conjugate as shown in FIG. 8. Therefore, Fresnel fringes are generated around the edge of the condenser aperture 26.

In this way, in the illumination optical system 202 equipped with three stages of condenser lenses, parallel illumination conditions can be achieved by making the electron beam source 10 and the front focal plane 4 of the objective lens 28 conjugate to each other but it is impossible to make the position of the condenser aperture 26 and the sample plane 2 conjugate to each other.

On the other hand, in the illumination optical system 20 of the transmission electron microscope 100, the electron beam source 10 and the front focal plane 4 of the objective lens 28 can be made conjugate to each other and the position of the condenser aperture 26 and the sample plane 2 can be made conjugate to each other by the use of the four stages of condenser lenses. Furthermore, in the illumination optical system 20, the illumination coverage can be varied while maintaining these two conjugate relationships. Therefore, in the illumination optical system 20, the sample S can be illuminated with parallel electron rays without producing Fresnel fringes.

As described above, in the transmission electron microscope 100, TEM observation can be performed by illuminating a narrow illumination coverage area with parallel electron rays. Therefore, the transmission electron microscope 100 is effective for use in cryoelectron microscopy for directly observing, for example, frozen samples by TEM.

Where a frozen sample is observed with a transmission electron microscope, if the illumination coverage is wider than the field of view of the microscope, the sample may be damaged or ice may melt in regions outside of the field of view of the microscope. For example, where a frozen sample is observed using Quantifoil (Trademark Registered) that is carbon film having holes 2 µm in diameter, in order to take images of a sample at plural locations, the sample being placed in one hole, it is desirable to focus the electron beam to the order of 0.5 µm in diameter. In the transmission electron microscope 100, if the electron beam is focused to the order of 0.5 µm in diameter, the Fresnel fringes produce no effect.

A control method for the transmission electron microscope 100 involves the steps of: setting the third condenser lens 23 and the fourth condenser lens 24 to a first set of conditions in which the position of the condenser aperture 26 and the sample plane 2 are made conjugate to each other; and setting the first condenser lens 21 and the second condenser lens 22 to a second set of conditions in which the electron beam source 10 and the front focal plane 4 of the objective lens 28 are made conjugate to each other while maintaining the first set of conditions for both the third condenser lens 23 and the fourth condenser lens 24. Therefore, the position of the condenser aperture 26 and the sample plane 2 can be made conjugate to each other, and it can be prevented that Fresnel fringes of the condenser aperture 26 are produced in the sample plane 2. Furthermore, because the electron beam source 10 and the front focal plane 4 of the objective lens 28 can be made conjugate to each other, the sample S can be illuminated with parallel electron rays. Thus, in this method of controlling the transmission electron microscope 100, if the sample S is illuminated with parallel electron rays, it can be prevented that Fresnel fringes of the condenser aperture 26 are generated in the sample plane 2. Consequently, TEM imaging can be performed by illuminating a narrow illumination coverage with parallel electron rays.

It is to be understood that the present invention is not restricted to the foregoing embodiments but rather they can be practiced in various modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A transmission electron microscope comprising:
    an electron beam source emitting an electron beam; and
    an illumination optical system for directing the emitted electron beam at a sample;
    wherein the illumination optical system comprises a first condenser lens, a second condenser lens disposed behind the first condenser lens, a third condenser lens disposed behind the second condenser lens, a fourth condenser lens disposed behind the third condenser lens, an objective lens disposed behind the fourth condenser lens, and a condenser aperture disposed at a position of the second condenser lens;

wherein the third and fourth condenser lenses cooperate to make a position of the condenser aperture and a sample plane conjugate to each other; and wherein the first and second condenser lenses cooperate to make the electron beam source and a front focal plane of the objective lens conjugate to each other while the conjugate relationship between the position of the condenser aperture and the sample plane is maintained by the third and fourth condenser lenses.

2. A transmission electron microscope as set forth in claim 1, wherein an illumination coverage in the sample plane provided by the electron beam is varied by varying excitations of the second condenser lens, the third condenser lens, and the fourth condenser lens while maintaining both the conjugate relationship between the position of the condenser aperture and the sample plane and the conjugate relationship between the electron beam source and the front focal plane of the objective lens.

3. A transmission electron microscope as set forth in claim 1, wherein the illumination optical system provides parallel illumination by the electron beam in the sample plane.

4. A control method for use in a transmission electron microscope having an electron beam source emitting an electron beam and an illumination optical system for directing the emitted electron beam at a sample, the illumination optical system comprising a first condenser lens, a second condenser lens disposed behind the first condenser lens, a third condenser lens disposed behind the second condenser lens, a fourth condenser lens disposed behind the third condenser lens, an objective lens disposed behind the fourth condenser lens, and a condenser aperture disposed at a position of the second condenser lens, the control method comprising:

setting the third and fourth condenser lenses to a first set of conditions in which a position of the condenser aperture and a sample plane are made conjugate to each other; and setting the first and second condenser lenses to a second set of conditions in which the electron beam source and a front focal plane of the objective lens are made conjugate to each other while the first set of conditions for the third and fourth condenser lenses is maintained.

* * * * *